US008044368B2

(12) United States Patent
Adamec

(10) Patent No.: US 8,044,368 B2
(45) Date of Patent: Oct. 25, 2011

(54) LENS COIL COOLING OF A MAGNETIC LENS

(75) Inventor: Pavel Adamec, Haar (DE)

(73) Assignee: ICT Integrated Circuit Testing Gesellschaft für Halbleiterprüftecknik mbH, Heimstetten (DE)

(*) Notice: Subject to any disclaimer, the term of this patent is extended or adjusted under 35 U.S.C. 154(b) by 206 days.

(21) Appl. No.: 12/047,614

(22) Filed: Mar. 13, 2008

(65) Prior Publication Data

US 2008/0224062 A1 Sep. 18, 2008

(30) Foreign Application Priority Data

Mar. 14, 2007 (EP) .................................... 07005310

(51) Int. Cl.
*H01J 1/50* (2006.01)
(52) U.S. Cl. ........................ 250/396 ML; 250/396 R
(58) Field of Classification Search ............. 250/396 R, 250/396 ML; 335/210, 213, 300
See application file for complete search history.

(56) References Cited

U.S. PATENT DOCUMENTS

| 2,819,431 | A | * | 1/1958 | Maxwell ........................ 335/219 |
| 3,351,754 | A | * | 11/1967 | Herrmann et al. ........ 250/396 R |
| 3,394,254 | A | * | 7/1968 | Le Poole ....................... 250/399 |
| 4,209,701 | A | * | 6/1980 | Dietrich et al. ........ 250/396 ML |
| 4,345,152 | A | * | 8/1982 | Gerlach ................... 250/396 ML |
| 4,806,767 | A | * | 2/1989 | Kubozoe et al. ....... 250/396 ML |
| 4,896,130 | A | * | 1/1990 | Ermilov et al. ............... 335/300 |
| 5,113,165 | A | * | 5/1992 | Ackermann .................. 335/216 |
| 5,289,009 | A | * | 2/1994 | Bakker et al. .......... 250/396 ML |
| 5,424,702 | A | * | 6/1995 | Kameoka et al. ............. 335/216 |
| 5,446,433 | A | * | 8/1995 | Laskaris et al. ............... 335/216 |
| 5,530,413 | A | * | 6/1996 | Minas et al. .................. 335/216 |
| 5,651,256 | A | * | 7/1997 | Herd et al. ..................... 62/51.1 |
| 5,960,868 | A | * | 10/1999 | Kuriyama et al. ............. 165/135 |
| 6,053,241 | A | * | 4/2000 | Kendall .................... 165/104.33 |
| 6,396,377 | B1 | * | 5/2002 | Ying ............................. 335/300 |
| 6,555,824 | B1 | * | 4/2003 | Feuerbaum et al. ...... 250/396 R |
| 6,570,476 | B1 | * | 5/2003 | Laskaris ....................... 335/216 |
| 6,852,982 | B1 | * | 2/2005 | Bierhoff et al. ........ 250/396 ML |
| 7,345,287 | B2 | * | 3/2008 | Jasinski et al. ......... 250/396 ML |
| 2002/0148971 | A1 | * | 10/2002 | Sogard ...................... 250/396 R |
| 2004/0056207 | A1 | * | 3/2004 | Petrov et al. .......... 250/396 ML |
| 2004/0144931 | A1 | * | 7/2004 | Harris ......................... 250/492.2 |
| 2005/0012049 | A1 | * | 1/2005 | Bierhoff et al. ........ 250/396 ML |
| 2007/0085019 | A1 | * | 4/2007 | Jasinski et al. ......... 250/396 ML |
| 2009/0206270 | A1 | * | 8/2009 | Glayish et al. ......... 250/396 ML |

FOREIGN PATENT DOCUMENTS

JP  05335219  12/1993

OTHER PUBLICATIONS

European Search Report, Appln No. 07005310.3, dtd Sep. 17, 2007.

* cited by examiner

*Primary Examiner* — Michael Maskell
(74) *Attorney, Agent, or Firm* — Patterson & Sheridan, L.L.P.

(57) ABSTRACT

A magnetic lens for a charged particle beam device and a charged particle beam device are provided. The magnetic lens includes a coil with coil windings to be excited for generation of a magnetic field, a pole piece to guide the magnetic field, a heat shield, which is connected to a cooling system, and a thermal insulation layer provided between the heat shield and the coil.

19 Claims, 6 Drawing Sheets

LENS COIL COOLING OF A MAGNETIC LENS

FIELD OF THE INVENTION

The invention relates to charged particle beam devices and methods of operating thereof. Particularly, it relates to a lens coil cooling of a magnetic lens of a charged particle beam device. More specifically, it relates to a magnetic lens, charged particle beam including a magnetic lens and a method of manufacturing a charged particle beam including a magnetic lens.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Examples of charged particle beam devices are electron microscopes, electron beam pattern generators, ion microscopes as well as ion beam pattern generators. Charged particle beams offer superior spatial resolution compared to photon beams, due to their short wave lengths.

Magnetic charged particle lenses have excitation coils which may be excited with high power. Thereby, the coil may heat up and a heat transfer from the coil to the pole pieces may occur. Even slight variations of the temperature of the pole pieces can lead to a thermal expansion. This thermal expansion may deteriorate the alignment of the charged particle beam column.

In light of the above, the coil might be surrounded by a thermally conductive housing, which is connected to a cooling pipe. However, homogeneous cooling system can be very complicated and areas of the thermally conductive housing, which are distant from the cooling pipe system, may show a temperature increase of up to 10° C.

SUMMARY

In light of the above, the present invention provides a magnetic lens according to independent claim 1, a charged particle beam device according to claim 11, and a method of manufacturing a magnetic lens according to independent claim 12.

According to one embodiment, a magnetic lens for a charged particle beam device is provided. The magnetic lens includes a coil with coil windings to be excited for generation of a magnetic field, a pole piece to guide the magnetic field, a heat shield, which is in thermal contact with a cooling system, and a thermal insulation layer provided between the heat shield and the coil.

Further advantages, features, aspects and details that can be combined with the above embodiments are evident from the dependent claims, the description and the drawings.

According to another embodiment, a charged particle beam device including a magnetic lens is provided. The magnetic lens includes a coil with coil windings to be excited for generation of a magnetic field, a pole piece to guide the magnetic field, a heat shield, which is in thermal contact with a cooling system, and a thermal insulation layer provided between the heat shield and the coil.

According to a further embodiment, a method of manufacturing a magnetic lens of a charged particle beam device is provided. The method includes providing a coil, shielding the coil with a sheet of thermally conductive material, thermally isolating the sheet of thermally conductive material from portions of the coil, and thermally connecting the thermally conductive material to a heat sink.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates or is manufactured. It includes method steps for manufacturing every part of the apparatus or carrying out every function of the apparatus.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE INVENTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a electron beam microscope including the detection of secondary electrons. The present invention can still be applied for other charged particle beam device, apparatuses and components using other charged particles and detecting secondary and/or backscattered charged particles in the form of electrons or ions, photons, X-rays or other signals in order to obtain a specimen image.

Within the following description of the drawings, the same reference numbers refer to the same components. Generally, only the differences with respect to the individual embodiments are described.

Figure 1:
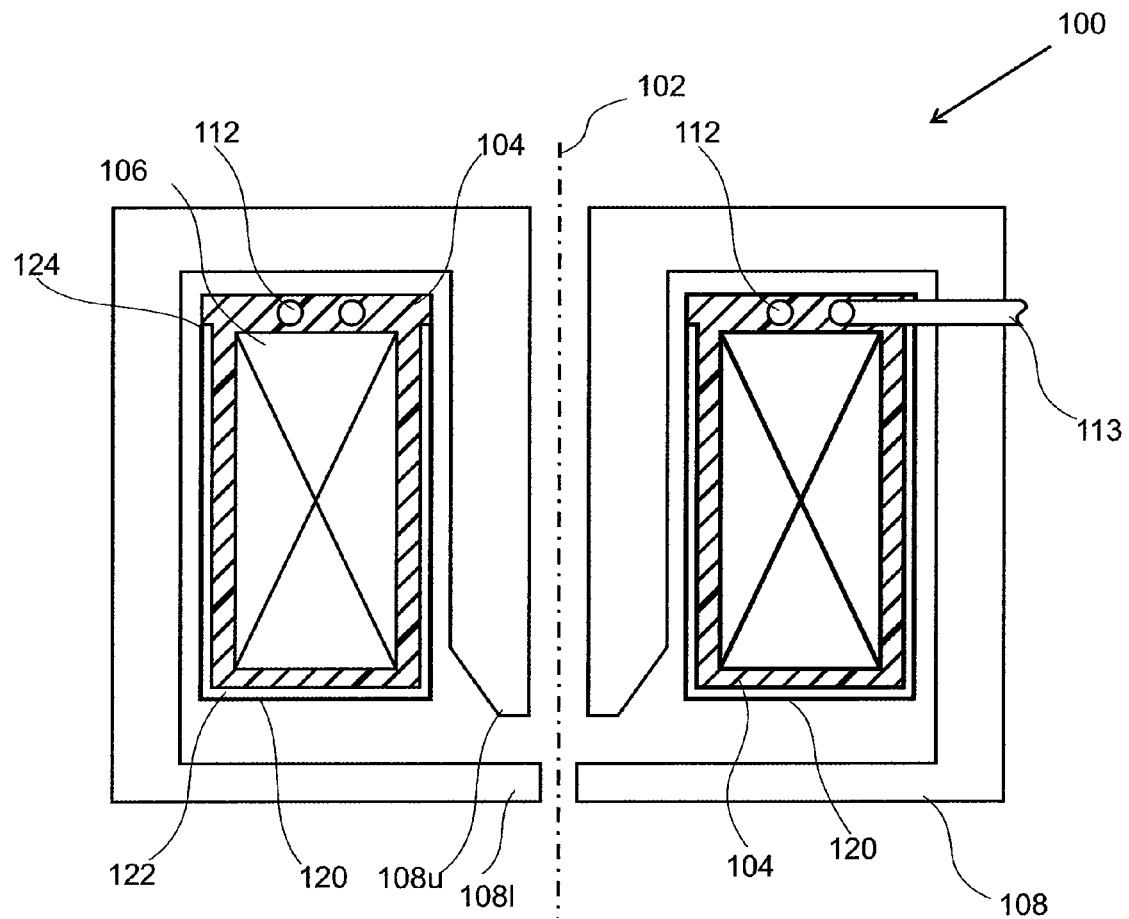
FIG. 1 shows a schematic view of a magnetic lens with a coil cooling system and a thermally isolated heat shield according to embodiments described herein.

As illustrated in FIG. 1, one embodiment of a magnetic lens 100 includes pole piece 108. The pole piece 108 has an upper pole piece 108u, lower pole piece 1081 and a gap between the pole pieces for guiding the magnetic field. A coil 106 is provided within an area surrounded by the pole piece. The coil includes a plurality of windings. Thereby, depending on the application, a power up to 100 W, 200 W or even higher may be applied to the coil in order to provide a magnetic focusing field. The rotational axis, which also defines the optical axis of the system, is denoted by reference numeral 102.

To reduce the heat transfer from the coil windings, a housing 104 including a thermally conductive material is provided. Within the housing 104 a cooling pipe system with cooling pipes 112 and an inlet 113 for the cooling fluid is provided.

According to one embodiment the housing may comprise copper, brass, or other materials with a high thermal conductivity. Generally, materials with a thermal conductivity above 50 W/m·K can be used. According to one embodiment materials with a thermal conductivity about 300 W/m·K or higher are used.

According to other embodiments described with respect to FIG. 1, the cooling pipe system have the cooling pipes 112 included in the housing 104, The cooling pipes are provided in at least one loop along circles in the base plate of the housing 104 of the coil 106. According to one embodiment, the cooling pipe is provided with at least two loops in order to provide a better uniformity of the cooling. According to even further embodiments, 4, 6 or even more loops of cooling pipes may be included in the housing.

Within FIG. 1, the cooling pipe system is provided in the upper part of the housing. A cooling pipe system included around the entire area of the housing may be very complex. As a consequence, the lower part of the housing 104 may heat up to a higher temperatures than the upper part of the housing. The heat transfer of the heated lower part of the housing 104 can deteriorate the alignment of the pole pieces.

According to embodiments described herein, an outer heat shield 120 is provided around the housing or the coil 106. Thereby, the outer heat shield 120 has a gap with a thermally isolating material or medium there between. At the upper portion 124 of the outer heat shield 120 a connection to the base plate of the housing 104 is provided. The connection at the upper portion 124 provides a heat transfer from the outer heat shield 120 to the housing 104 and the cooling pipe system included therein.

According to one embodiment, the thermally isolated medium can be air. According to another embodiment, the thermally isolating medium can be nitrogen, argon, or another gas. Further, solid materials like polyurethane or other materials used for thermal isolation can be used.

According to further embodiments, the thermal isolation layer can be provided by evacuating the gap between the heat shield 120 and the housing 104. Thereby, elements provided for evacuation of other portions within the charged particle beam column can, for example, be provided. According to one embodiment, the gap between the outer heat shield and the housing is vacuum sealed. According to another embodiment separate seal components may be omitted and an evacuation may be provided to extend less than in the case including separate vacuum seal means.

The shield surrounding the coil or the coil housing, which is thermally isolated from the coil or the coil housing and which has a thermal contact to a part including a cooling pipe system may reduce the temperature change of the assembly by more than a factor of 10.

Within the embodiments described herein, the outer shield may comprise a material like copper, brass or other materials with a high thermal conductivity. Generally, materials with a thermal conductivity above 50 W/m·K can be used. According to one embodiment materials with a thermal conductivity about 300 W/m·K or higher are used.

Yet according to a further embodiment the outer shield has a thickness of 0.5 mm to 3 mm. Typically, the heat shield 120 can have a thickness of 1 mm.

Within the embodiments described with respect to FIG. 1, the outer shield, which has a thermal isolation layer between the heat shield and the coil housing or the coil, surrounds the entire coil 106 except of the base plate of the housing 104, which includes the cooling pipe system. According to other embodiments (not shown) at least areas between the coil and sensitive parts of the pole pieces and/or the lens can be shielded with a thermally isolated shield.

Generally, for the embodiments described hearing, the heat shield, which is thermally isolated from the coils and which is connected to a heat sink including the cooling pipe system, is provided. According to some embodiments, the coil is surrounded by a housing made of thermally conductive material. Further a heat shield, which is thermally isolated from a portion of the housing made of thermally conductive material, is provided. Thereby, typically, there heat shield, which is thermally isolated, is made of a thermally conductive material.

Within the embodiments described herein, a thermal isolation from a portion is to be understood as providing a thermal isolation layer between a majority of the parts of the heat shield and the coil and the coil housing and providing thermal contact to a portion of the housing including a cooling pipe system or a base plate including a cooling pipe system.

Figure 2:
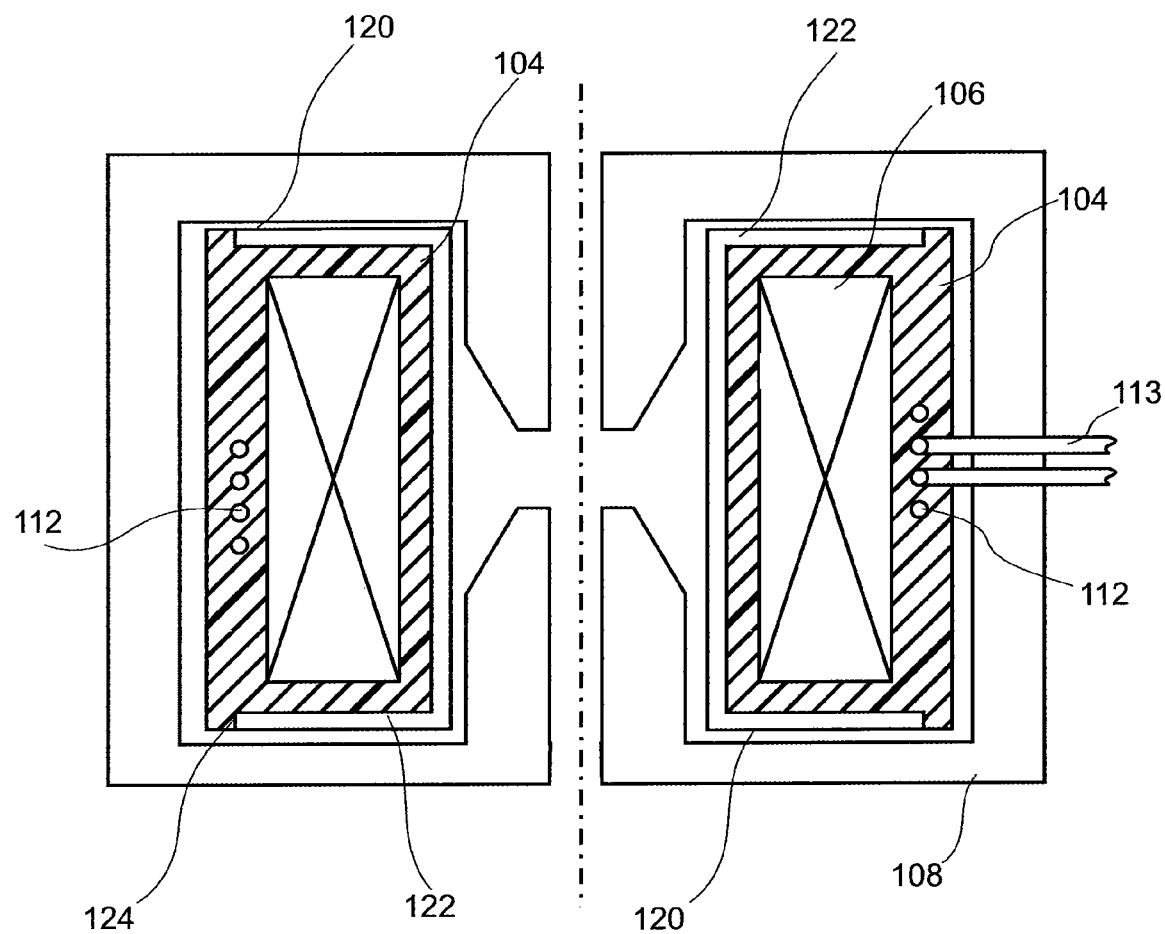
FIG. 2 shows a schematic view of a another magnetic lens with a coil cooling system and a thermally isolated heat shield according to embodiments described herein.

Within FIG. 1, a lens 108 as an objective lens is shown. Thereby, it may be appropriate to provide the cooling pipes system in the upper part of the housing. FIG. 2 shows another embodiment of a magnetic lens. Again, a pole piece 108 is shown. The coil 106 includes a plurality of windings. Thereby, depending on the application, a power of up to 100 W, 200 W or even higher may be applied to the coil in order to provide a magnetic focusing field.

To reduce the heat transfer from the coil windings, the housing 104 including a thermally conductive material is provided. Within the housing 104 a cooling pipe system with cooling pipes 112 and an inlet 113 for the cooling fluid is provided.

Between the housing 104 and the outer heat shield 120 is a gap with a thermally isolating material or medium there between. According to one embodiment, the thermally isolated medium can be air. According to another embodiment, the thermally isolating medium may be nitrogen, argon, or another gas. Further, solid materials like polyurethane or other materials used for thermal isolation can be used.

At the portion connecting the outer shield 120 and the base plate of the cooling system a connection to the housing 104 is provided. The connection provides a heat transfer from the outer heat shield 120 to the housing 104 and the cooling pipe system included therein.

Within FIG. 2, the base plate including the coiling pipe system is provided on the outer side of the housing 104. The outer heat shield, which is isolated from the coil and the coil housing by thermal isolation layer 122, is provided on the upper, inner and lower portion of the coil with respect to the optical axis of the lens. The outer shield, which thermally is isolated from portions of the coil or the coil housing, surrounds the entire coil 106 except of the base plate of the housing 104, which includes the cooling pipe system.

Figure 3:
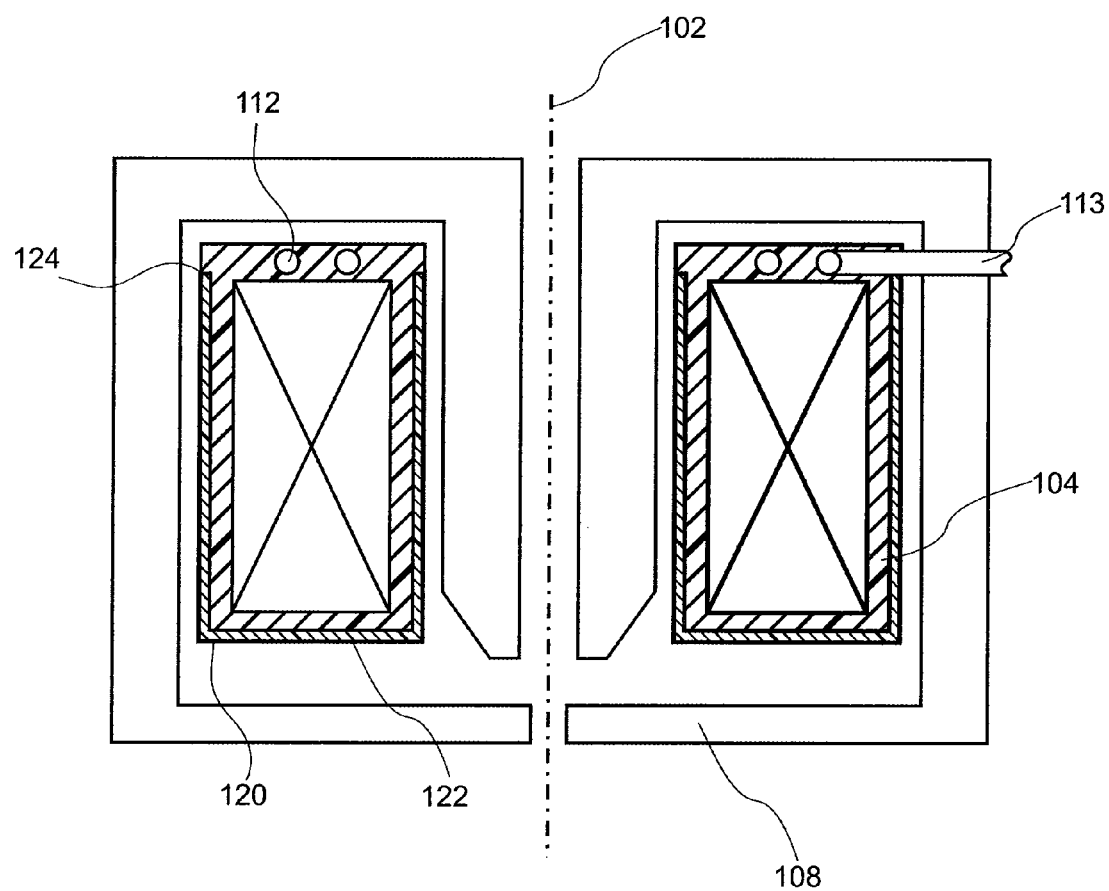
FIG. 3 shows a schematic view of yet another a magnetic lens with a coil cooling system and a thermally isolated heat shield according to embodiments described herein.

Within FIG. 3, a lens in the form of an objective lens is shown. The magnetic lens includes a pole piece 108. The coil 106 includes a plurality of windings. Thereby, depending on the application, high power may be applied to the coil in order to provide a magnetic focusing field. The high power results in a heating of the coil and a potential heat transfer to other parts of the lens like pole pieces and the like.

To reduce the heat transfer from the coil windings, the housing 104 including a thermally conductive material is provided. Within the housing 104 a cooling pipe system with cooling pipes 112 and an inlet 113 for the cooling fluid is provided. The rotational axis, which also defines the optical axis of the system, is denoted by reference 102.

The outer heat shield 120, which is isolated from portions of the coil and/or the coil housing by thermal isolation layer 122, is provided on the inner, lower and outer portion of the coil with respect to optical axis. The outer shield, which is isolated from the coil or the coil housing, surrounds the entire coil 106 except of the base plate of the housing 104, which includes the cooling pipe system.

The outer heat shield 120 has a gap with a thermally isolating material there between. At the upper portion 124 of the outer heat shield 120 a connection to the housing 104 is provided. The connection at the upper portion 124 provides a heat transfer from the outer heat shield 120 to the housing 104 and the cooling pipe system included therein.

Within FIG. 3, the thermally isolated and thermally conductive shield 120 is separated from the housing 104 by the thermal isolating layer 122 comprising a material like Polyurethane or the like. Generally, a thermal conductivity of below 0.2 W/mK is desired. This applies also to other media, like air, nitrogen, argon, or other gases, which are described herein.

Figure 4:
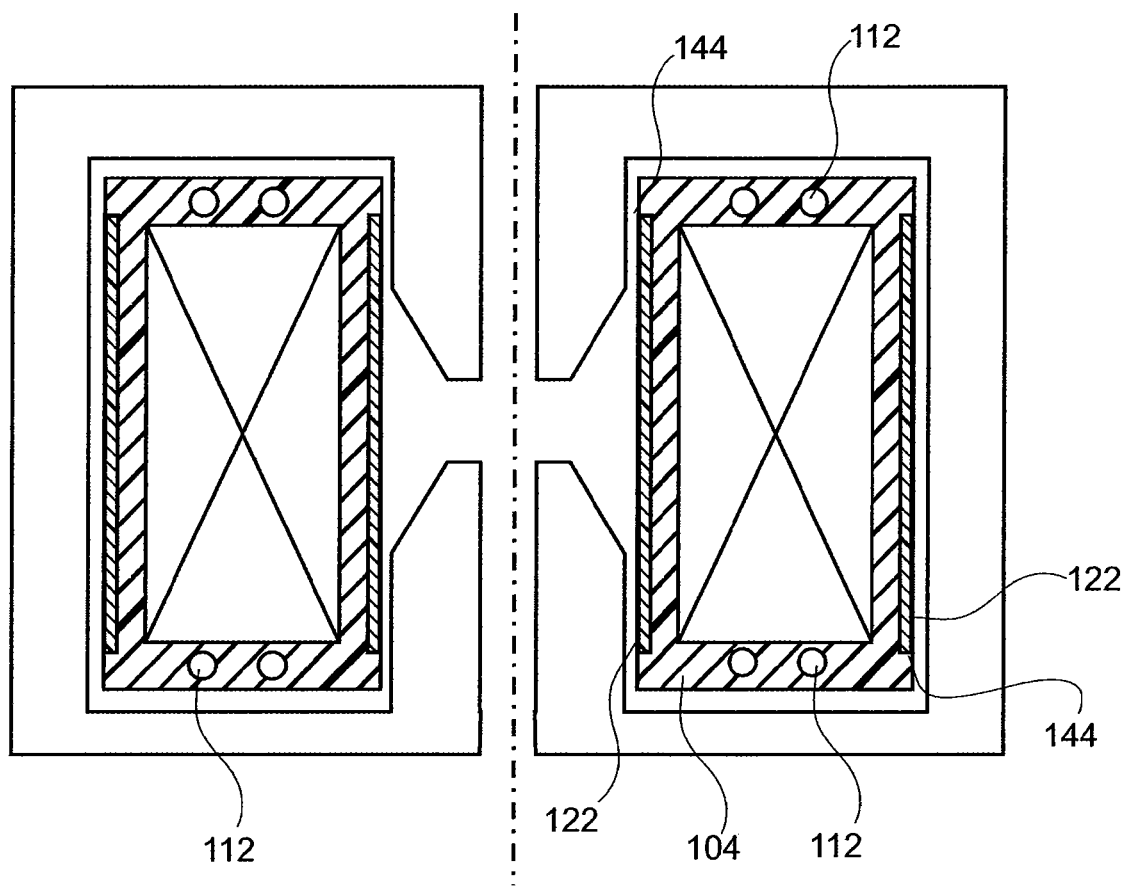
FIG. 4 shows a schematic view of a yet another magnetic lens with a coil cooling system and a thermally isolated heat shield according to embodiments described herein.

Within FIG. 4, the second heat shield, which is isolated by isolating layer 122, is provided on the inner side and the outer side of the housing with respect to the optical axis. Cooling pipes 112 are provided in the upper base plate and lower base plate of the housing 104. Within the embodiments described with regard to FIG. 4, the housing and the outer shield may comprise materials like copper, brass, or other materials with a high thermal conductivity. Generally, materials with a thermal conductivity above 50 W/m·K can be used. According to one embodiment materials with a thermal conductivity about 300 W/m·K or higher are used.

According to some embodiments, the thermally isolated material is a solid material like polyurethane or other materials used for thermal isolation. According to other embodiments, the thermally isolated medium can be air, nitrogen, argon, or another gas.

Figure 5:
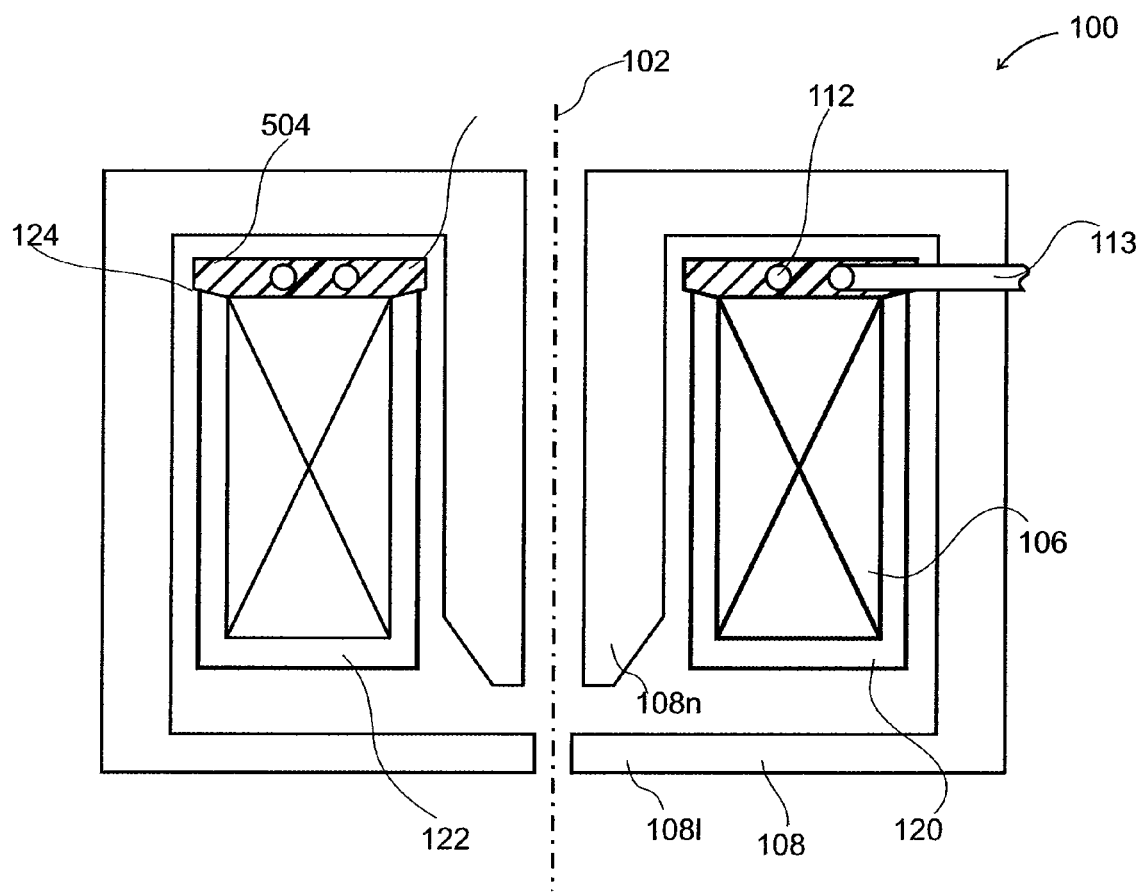
FIG. 5 shows a schematic view of a yet another magnetic lens with a coil cooling system and a thermally isolated heat shield according to embodiments described herein.

As illustrated in FIG. 5, a further embodiment of a magnetic lens 100 includes pole piece 108. The pole piece 108 has an upper pole piece 108u, lower pole piece 108l and a gap between the pole pieces for guiding the magnetic field. Within the pole piece the coil 106 is provided. The coil includes a plurality of windings. Thereby, depending on the application, a power up to 100 W, 200 W or even higher may be applied to the coil in order to provide a magnetic focusing field. The rotational axis, which also defines the optical axis of the system, is denoted by reference 102.

The embodiments described with respect to FIG. 5, have a cooling pipe system base plate 504. Therein cooling pipes 112 are provided. A cooling fluid may be provided via inlet 113.

According to other embodiments described with respect to FIG. 5, the cooling pipe system having the cooling pipes 112 are provided in at least one loop along circles in the base plate 514. According to one embodiment, the cooling pipe is provided with at least two loops in order to provide a better uniformity of the cooling. According to even further embodiments, 4, 6 or even more loops of cooling pipes may be included in the housing.

An outer heat shield 120 is provided around the coil 106. Thereby, the outer heat shield 120 has a gap in the form of a thermal isolation layer 122 with a thermally isolating material or medium between the coil and the heat shield. At the upper portion 124 of the outer heat shield 120 a connection to the base plate 504 is provided. The connection at the upper portion 124 provides a heat transfer from the outer heat shield 120 to the cooling pipe system included therein.

According to one embodiment, the thermally isolated medium or material within the gap can be air. According to another embodiment, the thermally isolating medium may be nitrogen, argon, or another gas. Further, solid materials like polyurethane or other materials used for thermal isolation can be used.

The shield surrounding the coil, which is thermally isolated from the coil and which has a thermal contact to a component including a cooling pipe system may reduce the temperature change of the assembly by more than a factor of 10.

Within the embodiments described herein, the outer heat shield 120 may comprise a material like copper, brass or other materials with a high thermal conductivity. Generally, materials with a thermal conductivity above 50 W/m·K can be used. According to one embodiment materials with a thermal conductivity about 300 W/m·K or higher are used.

Generally, for the embodiments described hearing, the heat shield, which is thermally isolated from the coil and which is connected to a heat sink including the cooling pipe system, is provided.

According to some embodiments, the coil is surrounded by a housing made of thermally conductive material. Then, a heat shield, which is isolated from portions of the housing made of thermally conductive material, is provided. Thereby, typically, there heat shield, which is thermally isolated, is made of a thermally conductive material.

Figure 6:
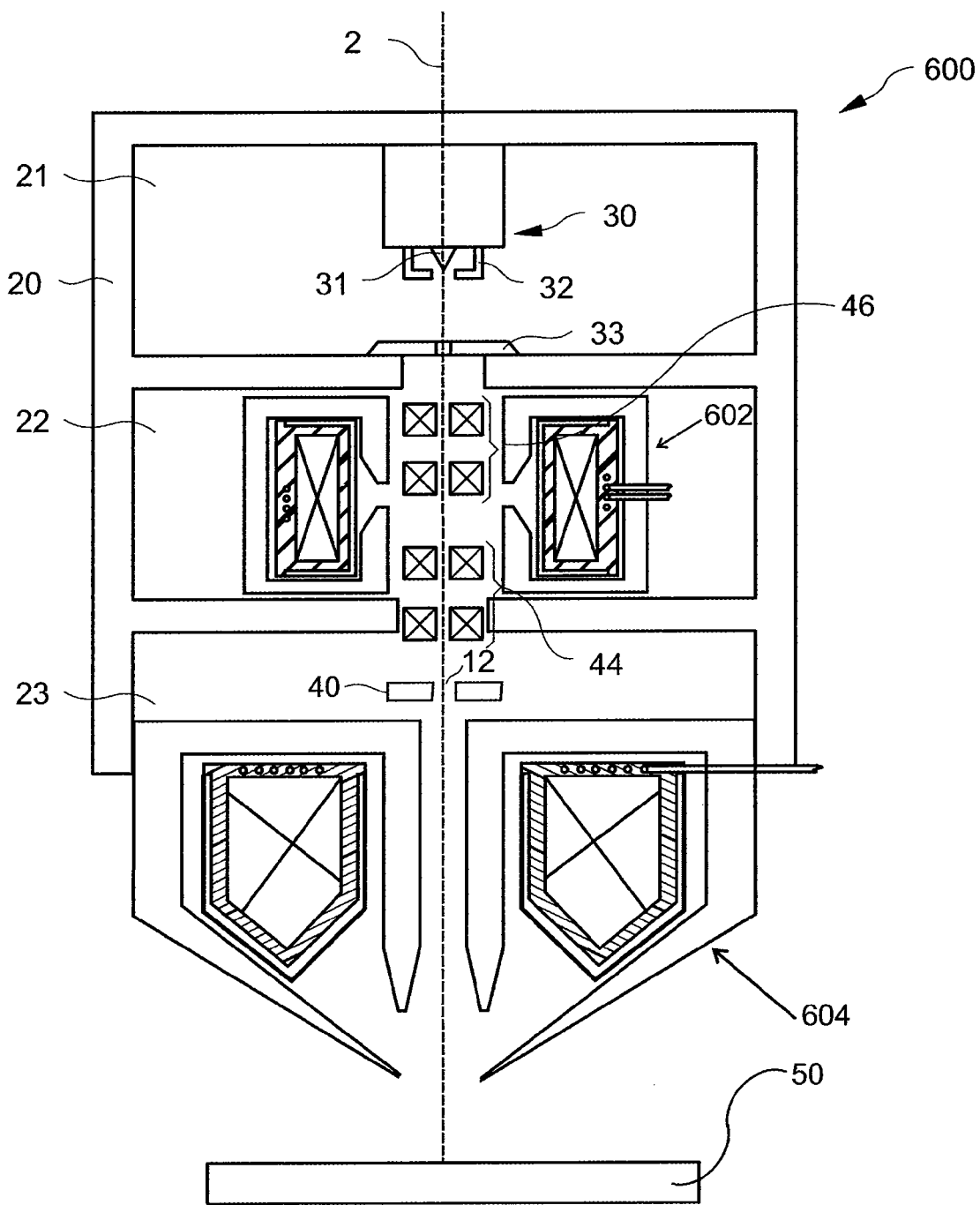
FIG. 6 shows a schematic view of a charged particle beam device including a magnetic lens according to embodiments described herein.

Within FIG. 6, a charged particle beam device 600 is shown. Electron gun 30 includes an emitter 31 and suppressor 32. The primary beam is emitted essentially along optical axis 2. The gun chamber housing is separated by aperture 33 from the following chamber. The aperture 33 can also act as an anode. The primary electron beam is formed and guided by condenser lens 602 and deflection units 44 and 46 for alignment of the primary charged particle beam. The primary electron beam passes through the opening in detector 40 and is focused by primary objective lens 604. The specimen 50 is provided below the objective lens. Within the embodiment of FIG. 6, condenser lens and/or objective lens may be provided according to any of the embodiments described herein.

Thereby, an outer heat shield, which has a thermal isolation layer between the heat shield and the coil housing or the coil and which is connected to a base plate including a cooling pipe system, is provided to reduce a heat transfer from the coil to the pole piece of the lens.

While the foregoing is directed to embodiments of the invention, other and further embodiments of the invention may be devised without departing from the basic scope thereof, and the scope thereof is determined by the claims that follow.

The invention claimed is:
1. A magnetic lens for a charged particle beam device, comprising:
  a coil including coil windings to be excited for generation of a magnetic field;
  a pole piece to guide the magnetic field;

a heat shield, which is in thermal contact with a cooling system; and a thermal insulation layer provided between the heat shield and the coil, wherein the cooling system is provided within a base plate and the base plate is connected to the heat shield to provide thermal contact with the cooling system and with the heat shield.

2. The magnetic lens according to claim 1, further comprising:

a housing surrounding the coil and including the cooling system, wherein the housing is provided between the thermal insulation layer and the coil.

3. The magnetic lens according to claim 2, wherein the base plate is formed by a portion of the housing.

4. The magnetic lens according to claim 1, wherein the heat shield comprises a material from the group consisting of: a material with a thermal conductivity of 200 W/mK or higher, copper and brass.

5. The magnetic lens according to claim 2, wherein the housing comprises a material from the group consisting of: a material with a thermal conductivity of 200 W/mK or higher, copper and brass.

6. The magnetic lens according to claim 1, wherein the thermal insulation layer comprises a medium or material from the group consisting of: a material with a thermal conductivity of 0.5 W/mK or less, air, nitrogen, argon, and polyurethane.

7. The magnetic lens according to claim 4, wherein the heat shield has a thickness of 0.5 mm to 2 mm.

8. The magnetic lens according to claim 1, further comprising: evacuation means for evacuating the area of the thermal insulation layer.

9. A charged particle beam device, comprising: a magnetic lens according to claim 1.

10. A method of manufacturing a magnetic lens of a charged particle beam device, comprising:

providing a coil;

shielding the coil with a sheet of thermally conductive material;

thermally isolating the sheet of thermally conductive material from portions of the coil;

thermally connecting the thermally conductive material to a heat sink; and providing a cooling system within a base plate, wherein the base plate is connected to the sheet of thermally conductive material to provide thermal contact with the sheet of thermally conductive material and with the cooling system.

11. The method of manufacturing a magnetic lens of a charged particle beam device according to claim 10, further comprising:

housing the coil with a further layer of a thermally conductive material provided, wherein the thermally isolation of the sheet of thermally conductive material is provided between the further layer of thermally conductive materials and the sheet of thermally conductive material.

12. A magnetic lens for a charged particle beam device, comprising:

a coil including coil windings to be excited for generation of a magnetic field;

a housing disposed around the coil;

a heat shield disposed around the housing and the coil, wherein the heat shield is thermally isolated from the coil and is in thermal contact with a cooling system;

a thermal insulation layer disposed in a gap between the heat shield and the housing; and a pole piece to guide the magnetic field generated by the coil, wherein the coil is disposed within an area surrounded by the pole piece, wherein the housing includes cooling pipes connected to the cooling system.

13. The magnetic lens of claim 12, wherein the housing comprises a base plate and the cooling pipes are provided in at least one loop along circles in the base plate.

14. The magnetic lens of claim 13, wherein the heat shield is connected to the base plate of the housing, and the heat shield transfers heat to the cooling system through the housing and the cooling pipes included therein.

15. The magnetic lens of claim 12, wherein the thermal insulation layer is air.

16. The magnetic lens of claim 12, wherein the thermal insulation layer is nitrogen, argon, or another gas.

17. The magnetic lens of claim of claim 12, wherein a power provided to the coil results in a heating of the coil, and the heat shield and thermal insulation layer are configured to reduce heat transfer from the coil to the pole piece.

18. The magnetic lens according to claim 1, wherein a power provided to the coil results in a heating of the coil, and the heat shield and thermal insulation layer are configured to reduce heat transfer from the coil to the pole piece.

19. The magnetic lens according to claim 1, wherein the thermal insulation layer comprises air, argon, nitrogen, or another gas.

* * * * *

UNITED STATES PATENT AND TRADEMARK OFFICE
CERTIFICATE OF CORRECTION

| | | |
|---|---|---|
| PATENT NO. | : 8,044,368 B2 | Page 1 of 1 |
| APPLICATION NO. | : 12/047614 | |
| DATED | : October 25, 2011 | |
| INVENTOR(S) | : Adamec | |

It is certified that error appears in the above-identified patent and that said Letters Patent is hereby corrected as shown below:

ON THE TITLE PAGE:

Item (73) Assignee:

Please delete "Halbleiterprüftecknik" and insert --Halbleiterprüftechnik-- therefor.

Signed and Sealed this
Seventeenth Day of January, 2012

David J. Kappos
*Director of the United States Patent and Trademark Office*